United States Patent
Long (10) Patent No.: US 10,060,022 B2
(45) Date of Patent: Aug. 28, 2018

(54) DEVICE AND METHOD FOR GENERATING A VAPOR FOR A CVD OR PVD DEVICE FROM MULTIPLE LIQUID OR SOLID SOURCE MATERIALS

(71) Applicant: AIXTRON SE, Herzogenrath (DE)

(72) Inventor: Michael Long, Herzogenrath-Kohlscheid (DE)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 15/318,917

(22) PCT Filed: Jun. 16, 2015

(86) PCT No.: PCT/EP2015/063382
§ 371 (c)(1),
(2) Date: Dec. 14, 2016

(87) PCT Pub. No.: WO2016/000944
PCT Pub. Date: Jan. 7, 2016

(65) Prior Publication Data
US 2017/0114445 A1    Apr. 27, 2017

(30) Foreign Application Priority Data

Jul. 1, 2014   (DE) .................. 10 2014 109 195

(51) Int. Cl.
*C23C 14/22*    (2006.01)
*C23C 14/26*    (2006.01)
(Continued)

(52) U.S. Cl.
CPC ............ *C23C 14/228* (2013.01); *C23C 14/12* (2013.01); *C23C 14/26* (2013.01);
(Continued)

(58) Field of Classification Search
None
See application file for complete search history.

(56) References Cited

U.S. PATENT DOCUMENTS

| 2,447,789 A | 8/1948 | Barr |
| 4,769,292 A | 9/1988 | Tang et al. |

(Continued)

FOREIGN PATENT DOCUMENTS

| DE | 102011051260 A1 | 12/2012 |
| DE | 102011051261 A1 | 12/2012 |

(Continued)

OTHER PUBLICATIONS

International Search Report dated Oct. 19, 2015, from the European Patent Office, for International Patent Application No. PCT/EP2015/063382 (filed Jun. 16, 2015), 7 pgs.

(Continued)

*Primary Examiner* — Joseph Albert Miller, Jr.
(74) *Attorney, Agent, or Firm* — Ascenda Law Group, PC (57) ABSTRACT

In a method and a device for generating vapor for a CVD or PVD device, liquid or solid particles of a first source material are fed into a first heat transfer body via a first feed line. The first heat transfer body vaporizes the particles into a first vapor, which is transported by a carrier gas from the first heat transfer body into a second heat transfer body arranged after the first heat transfer body. The first heat transfer body is heated to a first temperature, and the second heat transfer body is heated to a second temperature. Liquid or solid particles of a second source material are fed into a second heat transfer body via a second feed line. The second heat transfer body vaporizes the particles into a second vapor, which is transported along with the first vapor out of the second heat transfer body by the carrier gas.

9 Claims, 4 Drawing Sheets

(51) Int. Cl.
*C23C 16/455* (2006.01)
*C23C 14/12* (2006.01)

(52) U.S. Cl.
CPC .. *C23C 16/45512* (2013.01); *C23C 16/45565* (2013.01); *C23C 16/45574* (2013.01)

(56) References Cited

U.S. PATENT DOCUMENTS

| | | | |
|---|---|---|---|
| 4,885,211 A | 12/1989 | Tang et al. | |
| 2003/0080325 A1* | 5/2003 | Uchiyama | C23C 16/40 252/500 |
| 2004/0083962 A1* | 5/2004 | Bang | C23C 16/4401 118/715 |
| 2005/0109281 A1* | 5/2005 | Jurgensen | C23C 14/12 118/725 |
| 2005/0208220 A1* | 9/2005 | Long | C23C 14/12 427/255.6 |
| 2007/0194470 A1* | 8/2007 | Dedontney | B01F 3/022 261/76 |
| 2011/0268870 A1 | 11/2011 | Ohmi et al. | |

FOREIGN PATENT DOCUMENTS

| | | |
|---|---|---|
| EP | 0982411 A2 | 3/2000 |
| WO | 2004/009868 A1 | 1/2004 |
| WO | 2012/175124 A1 | 12/2012 |
| WO | 2012/175126 A1 | 12/2012 |
| WO | 2012/175128 A1 | 12/2012 |
| WO | 2013/181521 A9 | 12/2013 |

OTHER PUBLICATIONS

Written Opinion dated Oct. 19, 2015, from the European Patent Office, for International Patent Application No. PCT/EP2015/063382 (filed Jun. 16, 2015), 7 pgs.
International Preliminary Report on Patentability dated Jan. 3, 2017, from the International Bureau of WIPO, for International Patent Application No. PCT/EP2015/063382 (filed Jun. 16, 2015), 8 pages.
International Preliminary Report on Patentability dated Jan. 3, 2017, from the International Bureau of WIPO, for International Patent Application No. PCT/EP2015/063382 (filed Jun. 16, 2015), English Translation, 8 pages.
Written Opinion dated Oct. 19, 2015, from the ISA, European Patent Office, for International Patent Application No. PCT/EP2015/063382 (filed Jun. 16, 2015), English Translation, 7 pages.

* cited by examiner

DEVICE AND METHOD FOR GENERATING A VAPOR FOR A CVD OR PVD DEVICE FROM MULTIPLE LIQUID OR SOLID SOURCE MATERIALS

RELATED APPLICATIONS

This application is a National Stage under 35 USC 371 of and claims priority to International Application No. PCT/EP2015/063382, filed 16 Jun. 2015, which claims the priority benefit of DE Application No. 10 2014 109 195.7, filed 1 Jul. 2014.

The invention relates to a method for generating a vapor in a CVD or PVD device, in which the heat of vaporization is transferred to liquid or solid particles of a first source material by bringing the particles into contact on heat transfer surfaces of a first heat transfer body, which exhibits a first temperature, so that a first vapor forms, which is transported out of the heat transfer body by a carrier gas, wherein the first vapor is transported by the carrier gas into a second heat transfer body, which is arranged in the direction of the carrier gas flow at a distance after the first heat transfer body, and exhibits a second temperature.

The invention further relates to a device for generating a vapor for a CVD or PVD device for implementing the method, with a first heat transfer body, which exhibits heat transfer surfaces for transferring the heat of vaporization to liquid or solid particles of a first source material that are fed into the first heat transfer body via a first feed line, wherein the vapor generated by vaporizing the particles can be brought by a carrier gas from the first heat transfer body into a second heat transfer body in the direction of carrier gas flow, the latter being arranged after the first heat transfer body in the direction of carrier gas flow, wherein the first heat transfer body can be heated to a first temperature, and the second heat transfer body can be heated to a second temperature.

WO 2012/175128 A1, WO 2012/175124 A1, WO 2012/175126 as well as DE 10 2011 051 261 A1 or DE 10 2011 051 260 A1 show devices for providing a vapor, in which one or more electrically conductive solid foams are used, which can be used to supply heat of vaporization to an aerosol. Allowing a flow to pass through causes the cell walls of the open-celled foam body to heat up. Heat of vaporization is transferred to the particles coming into contact with the cell walls, so that the particles undergo a phase transformation. They transform into a vapor, which is transported by a carrier gas toward a gas inlet unit of a CVD reactor in the direction of flow. A chemical reaction can take place in the CVD reactor. Instead of the CVD reactor, however, use can also be made of a PVD reactor, which exhibits a cooled susceptor, upon which lies a substrate to be coated. The vapor condenses on the surface of the substrate, and thereby forms a layer.

U.S. Pat. Nos. 4,769,292 and 4,885,211 describe the manufacture of light-emitting diodes (OLED) out of organic source materials. In particular, the invention relates to a device for depositing such organic layers onto a substrate, so that OLED components can be fabricated out of the coated substrates.

U.S. Pat. No. 2,447,789 and EP 0 982 411 also describe methods for depositing layers in the low-pressure range. The used source materials are not present in gaseous form, but rather as solids or liquids. In order to bring them into the vapor phase, heat of vaporization must be fed to the solids or liquids. This requires that the source materials be heated. A strong heat flow to the source materials is required for realizing a high vaporization performance. The source materials are brought into contact with the hot surfaces as aerosols. However, heat transfer is limited by a maximum permissible temperature gradient. Specifically, the source materials cannot be heated in excess of their chemical decomposition temperature. In prior art, this is why only small quantities of source materials are brought into contact with hot contact surfaces. As a consequence, the vaporization rate is low.

It is further required that several differing organic source materials be used. These differing source materials generally also have differing vaporization temperatures or decomposition temperatures. Using several organic source materials is necessary in particular for electrically doping a layer to be deposited.

Therefore, the object of the invention is to indicate a method or a device with which source materials exhibiting differing chemical and/or physical properties can be vaporized.

The object is achieved by the invention indicated in the claims.

According to the invention, use is made of a multistage vaporization device. The vaporization device has at least two heat transfer bodies, which exhibit heat transfer surfaces. The heat transfer bodies are arranged one after the other in the direction of flow. A carrier gas flows through at least one upstream heat transfer body. A first aerosol is fed into the upstream heat transfer body. The particles vaporize by coming into contact with the heat transfer surfaces. The vaporized first source material is fed by the carrier gas into at least one second downstream heat transfer body. A second aerosol is fed into this at least one first downstream heat transfer body. The particles of the second aerosol vaporize by coming into contact with the heat transfer surfaces of the at least one downstream heat transfer body. As a consequence, the carrier gas transports a stream of gas consisting of the vapor of two differing source substances out of the last downstream heat transfer body. The several heat transfer bodies arranged one after the other in the direction of flow, before which one respective aerosol feed line opens or into which the respective one aerosol feed line opens, can exhibit differing temperatures. The temperatures of the heat transfer bodies arranged one after the other in the direction of flow preferably differ in such a way that a respective heat transfer body arranged upstream has a lower temperature than the respective heat transfer body arranged downstream. The heat transfer bodies hence have a temperature that incrementally rises in the direction of flow. The temperatures of the heat transfer bodies are preferably selected in such a way that an aerosol with a lower vaporization temperature is or can be fed into the at least one upstream heat transfer body, and an aerosol with a higher vaporization temperature is or can be fed into the at least one downstream heat transfer body. Due to the low contact period or retention period of the vaporized aerosol in the at least one downstream vaporization body exhibiting a higher temperature, there is only a negligible vapor dispersion, of any. In the simplest case, the device has or the method is implemented in a device that exhibits two heat transfer bodies arranged one after the other. The first heat transfer body viewed in the direction of flow can have a preheating body situated before it in the direction of flow. This preheating body is used to preheat a carrier gas. The preheated carrier gas flows into the first heat transfer body, either directly or after passing through a free clearance space. A first feed line for a first aerosol opens into the first transfer body or into a clearance space before the first transfer body. The first aerosol is fed into the first heat transfer body. The first aerosol is vaporized by the aerosol particles coming into contact with the heat transfer surfaces of the heat transfer body. The second heat transfer body is located downstream from the first heat transfer body. A clearance space can be provided between the first heat transfer body and second heat transfer body. A second aerosol feed line can open into the clearance space or directly into the second heat transfer body. A second aerosol is fed through this second aerosol feed line into the second heat transfer body, wherein the particles of the second aerosol come into contact with the heat transfer surfaces of the second heat transfer body. Several additional heat transfer bodies can be arranged behind the second heat transfer body in the direction of flow, into which another respective aerosol can be fed. This results in a cascaded vaporization device. The vaporization bodies are heated to a vaporization temperature by passing through an electrical current. The vaporization temperatures of the differing heat transfer bodies can vary from each other. In particular, it is provided that the vaporization temperature of the individual heat transfer bodies increase in the direction of flow, so that the aerosol with the lowest vaporization temperature is fed into the first vaporization body in the direction of flow, and the aerosol with the highest vaporization temperature is fed into the last vaporization body in the direction of flow. The contact period between the aerosol bodies and heat transfer surfaces is minimized by virtue of the fact that the heat transfer bodies, but also the preheating body, consist of a solid foam of the kind disclosed in WO 2012/175124, WO 2012/175126 or WO 2012/175128. For this reason, the disclosure content of these publications is included in its entirety in the disclosure content of this application. Involved here is a solid foam with a porosity of 500 to 200, preferably 100 pores per inch. The share of all open areas on the surface of the solid foam is greater than 90 percent. The walls of all open cells are brought to the vaporization temperature by passing through an electrical current. A last heatable or even coolable solid foam can be arranged in the direction of flow behind the last heat transfer body into which an aerosol is individually fed. This foam body serves to modulate the vapor flow. A partial condensation can there take place by lowering its temperature. The vapor transported by a carrier gas and exiting the last vaporization body or solid body in the direction of flow is introduced into a process chamber of a PVD reactor. This can take place via a gas inlet unit in the form of a showerhead. However, the vapor can also be fed in directly from the gas outlet surface of the last foam body in the direction of flow. The cooled susceptor bears a substrate that is coated with the vapor comprised of several materials. Coating takes place via condensation.

The heat transfer body arranged last in the direction of flow has the property of homogeneously mixing the individual vapors. For this reason, the heat transfer body arranged last in the direction of flow can form a gas outlet surface that simultaneously forms a gas inlet surface of a process chamber. The heat transfer body arranged last in the direction of flow with its gas outlet surface can thus be the upper boundary of a process chamber. The heat transfer bodies can exhibit a round or rectangular contour. They can be thinner in the middle than at the edge. As a consequence, they can exhibit meniscus-shaped upper sides and lower sides.

Exemplary embodiments of the invention will be explained below based on attached drawings. Shown on.

Figure 1:
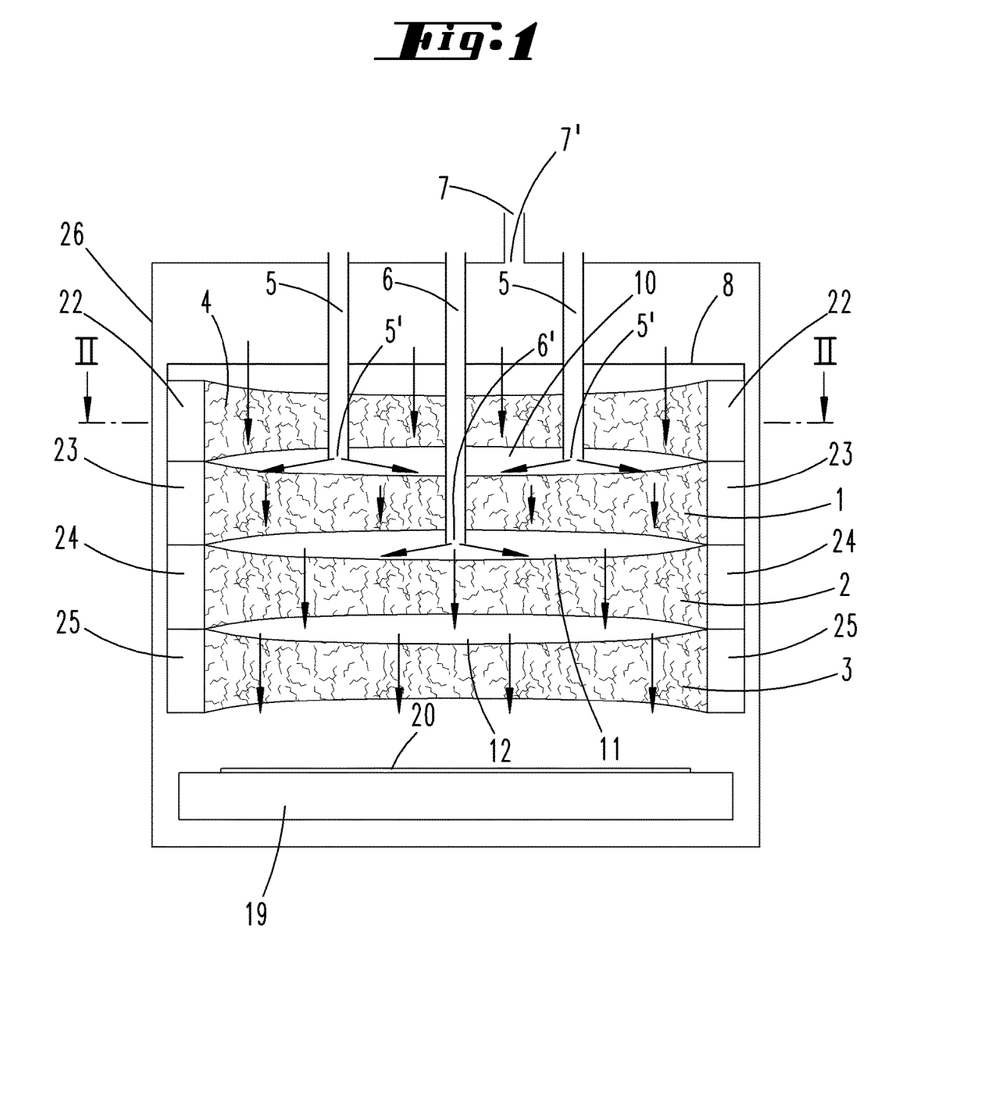
FIG. 1 is a schematic view of the structural design of a coating device with a multistage aerosol vaporizer.

FIG. 1 shows a schematic view of a reactor housing 26, which incorporates a coolable susceptor 19, on which one or several substrates 20 are arranged.

A carrier gas flows through the reactor housing 26 from top to bottom. The carrier gas is fed in through a feed line 7. A first aerosol is fed in through a feed line 5, two or four of which are present in the exemplary embodiment, and a second aerosol is fed in through a feed line 6. The two aerosols are chemically different from each other, and have differing vaporization temperatures. The vaporization temperature of the first aerosol is less than the vaporization temperature of the second aerosol.

A preheating body 4 that extends over the entire cross sectional surface of the reactor housing 26 is located directly behind the opening 7' of the carrier gas feed line in the direction of flow. An electrical current introduced into the preheating body 4 via electrical contacts 22 can be used to heat the preheating body 4 to a temperature that roughly corresponds to the vaporization temperature of the first aerosol.

Feed lines 5, 6 comprised of pipes penetrate through the preheating body 4. The opening 5' of the first feed line 5 is located in an intermediate space 10, which is arranged downstream from the preheating body 4 and upstream from a first vaporization body 1. The vaporization body 1 extends over the entire cross sectional surface of the reactor housing 26. An electrical current introduced into the first vaporization body 1 via contacts 23 brings the vaporization body 1 up to a first vaporization temperature. The heated carrier gas exiting the preheating body 4 and the first aerosol fed into the intermediate space 10 enter into the first vaporization body 1. The aerosol particles then come into physical contact with vaporization surfaces of the first heat transfer body 1. The first aerosol vaporizes completely inside the first heat transfer body 1. The latter is transported by the carrier gas stream out of the first heat transfer body 1 into a second intermediate space 11, which is located behind the first heat transfer body 1 in the direction of flow, and before a second heat transfer body 2 in the direction of flow.

Located in the second intermediate space 11 is the opening 6' of the second aerosol feed line 6, through which the second aerosol is fed in at a higher vaporization temperature.

An electrical current introduced into the second heat transfer body 2 via electrical contacts 24 can be used to heat the second heat transfer body 2 to a second vaporization temperature that is greater than the first vaporization temperature. The aerosol stream exiting the opening 6' and the vapor transported by the carrier gas and exiting the first heat transfer body 1 enters into the second vaporization body 2.

The particles of the second aerosol are vaporized in the second heat transfer body 2. The vapor from the first source material passes through the second heat transfer body 2 essentially undispersed and uninfluenced.

Located behind the second heat transfer body 2 in the direction of flow is a third intermediate space 12. The intermediate space 12 is located above the last heat transfer body 3 in the direction of flow, which can be heated to a temperature by introducing an electrical current into contacts 25. Also provided are means for cooling the last heat transfer body 3, so that condensation can take place in the heat transfer body 3. For example, such means can consist of a feed line (not shown), through which a cooled carrier gas is fed into the intermediate space 12. In order to coat the substrate 20, however, the heat transfer body 3 is kept at a temperature where no condensation takes place on the heat transfer surfaces of the heat transfer body 3. A process gas comprised of two different vapors then exits the outlet surface of the heat transfer body 3. The vapor condenses on the surface of the substrate 20, which is kept at a deposition temperature by the susceptor 19.

The job of the heat transfer bodies 1 and 2 is to vaporize a respective aerosol fed into them. The heat transfer bodies 1, 2 thus constitute vaporization bodies.

The aerosols can contain a layer-forming source material and a doping source material. They can also contain several layer-forming materials. Possible in particular are organic materials, which are used for depositing OLEDs.

In the exemplary embodiment shown on FIG. 1, the lower side or a broadside surface of the last heat transfer body 3 in the direction of flow pointing toward the susceptor comprises a gas outlet surface, and forms the upper side of a process chamber, whose lower side consists of the upper side of the susceptor 19.

The heat transfer bodies 1 to 3 along with the preheating body 4 are comprised of a solid foam, which exhibits a suitable porosity, for example of 100 pores per inch. Depending on the intended use, the porosity can lie between 50 and 500 pores per inch. The heat transfer bodies can exhibit a circular contour. In the exemplary embodiment, the heat transfer bodies 1 to 3 along with the preheating body 4 exhibit a rectangular contour. They are somewhat thinner in design in the middle than on the edge. As a result, the intermediate spaces are formed by the meniscus-shaped lower side and upper side of the foam bodies 1 to 4 when their edges lie one on top of the other with contact. The feed lines 5 and 6 consist of pipes, which penetrate openings in the foam body 4 or 1 like a lance.

Figure 2:
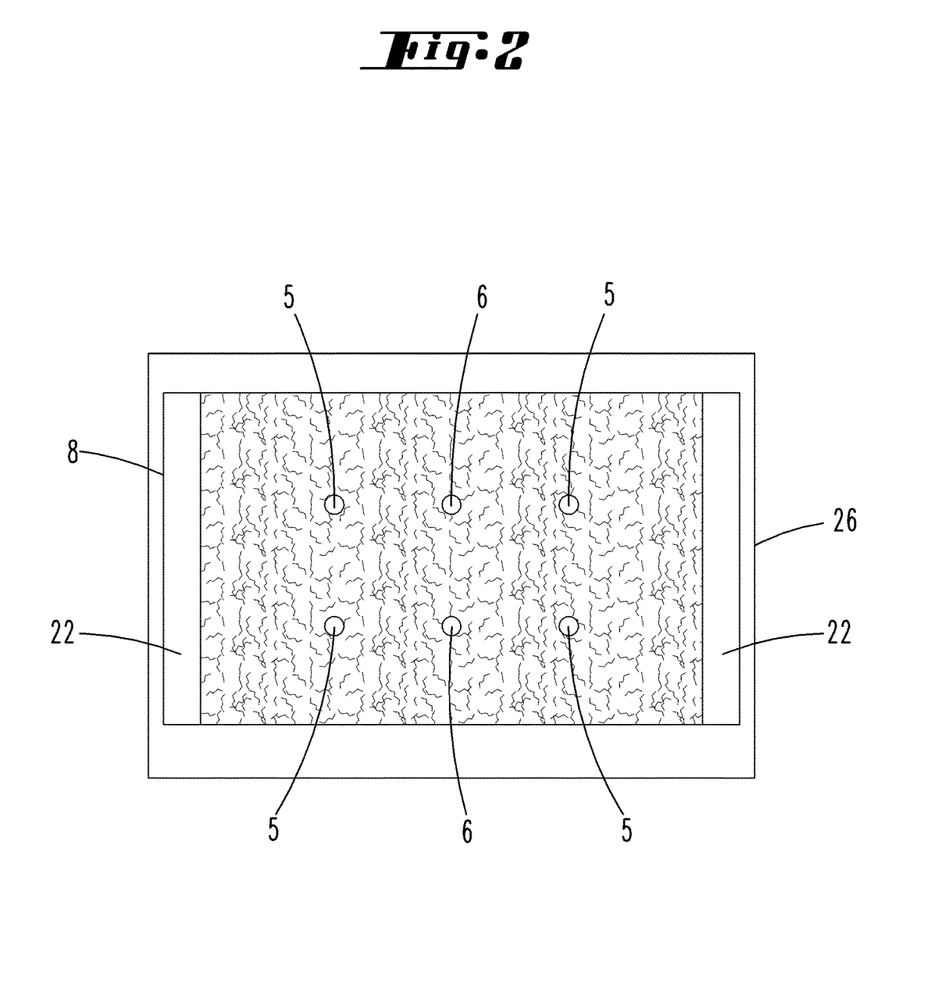
FIG. 2 is a section along the II-II line on FIG. 1.

Because the second exemplary embodiment shown on FIG. 2 has an essentially identical vaporization device as the exemplary embodiment described on FIG. 1, reference is made to the statements therein. The first aerosol feed line 5 is fed by a first aerosol generator 15. The second aerosol feed line 6 is fed by a second aerosol generator 16. The carrier gas lines 7 are fed by a carrier gas source 17. The carrier gas source 17 can be a hydrogen source, a nitrogen source or an inert gas source.

Located downstream from the last heat transfer body 3 in the direction of flow is a funnel-shaped gas outlet channel, whose walls 9 are heated. The gas outlet channel ends in a gas outlet opening 13, through which the vapor mixture transported by the carrier gas can enter into a gas inlet unit 14 of a CVD reactor 26. In this exemplary embodiment, the vaporization device exhibits its own housing 8, which is joined with the reactor housing 26 in the area of the gas outlet opening 13 via the heated walls 9.

The gas inlet unit 14 consists of a showerhead, which exhibits a plurality of gas outlet openings, through which the process gas comprised of the carrier gas-vapor mixture can flow into the process chamber 18, in which a substrate 20 cooled to the deposition temperature is arranged.

A vacuum device 21 having a pump can be used to evacuate the process chamber 18 or keep it at a low pressure.

Figure 4:
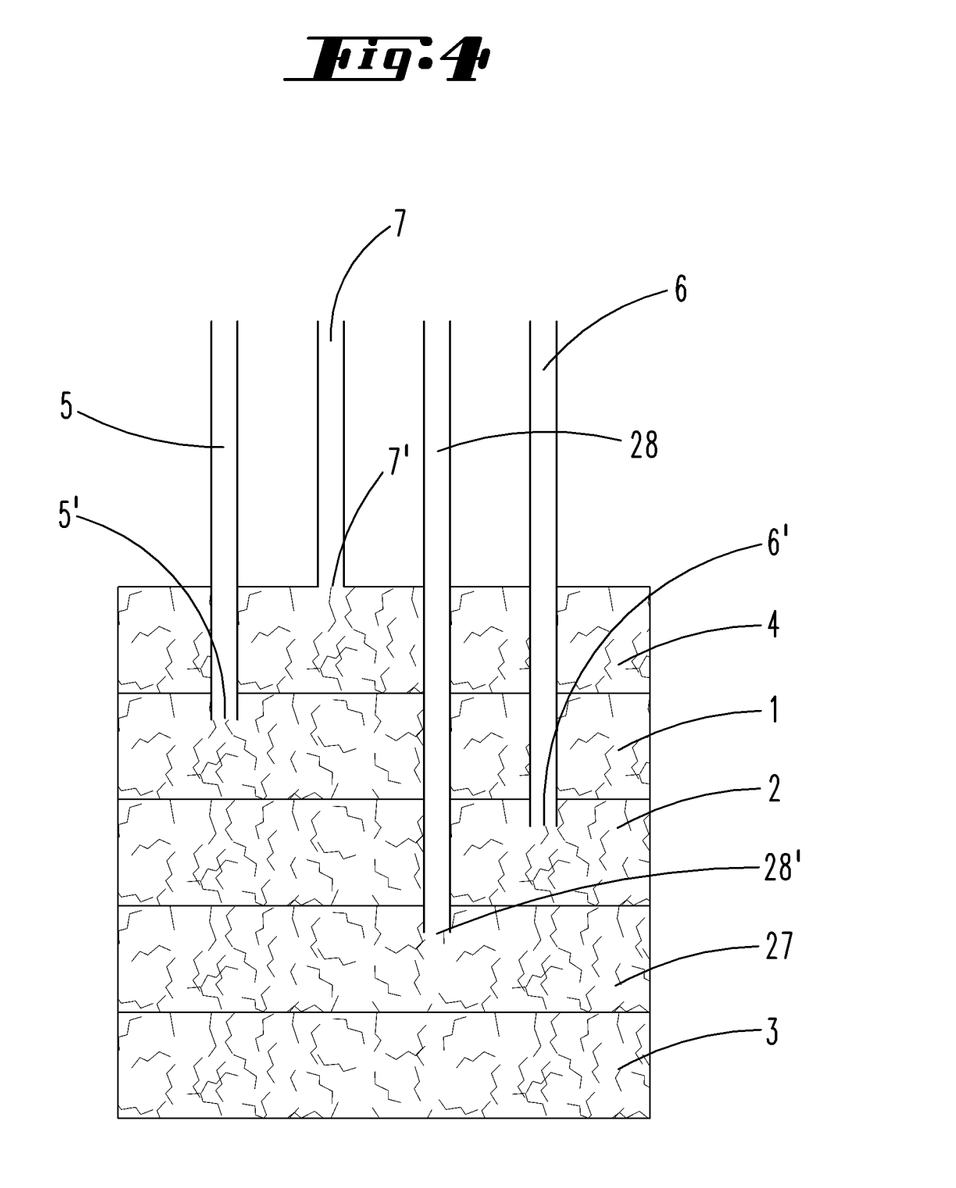
FIG. 4 is another exemplary embodiment of a multistage aerosol vaporizer.

The third exemplary embodiment shown on Fig. 4 depicts a three-stage vaporizer. A carrier gas fed in via a feed line 7 is preheated in a preheating unit 4 here as well. A first aerosol feed line 5 opens into a first heat transfer body 1. A second aerosol feed line 6 for a second aerosol opens into a second heat transfer body 2. A third aerosol line 28 through which a third aerosol can be fed into the third heat transfer body 27 opens into a third heat transfer body 27. Provided here as well is a last heat transfer body 3 in the direction of flow, through which all of the three generated vapors must pass.

The three heat transfer bodies 1, 2, 27 are arranged one behind the other in the direction of carrier gas flow. A cascaded vaporization of several aerosols takes place one after the other in the direction of carrier gas flow. An aerosol is individually fed to each vaporization body 1, 2, 27. The vaporization bodies 1, 2, 27 arranged one behind the other are heated to different vaporization temperatures, wherein a vaporization body lying downstream is always heated to a higher temperature than the respective vaporization body lying upstream therefrom. The aerosol with the lowest vaporization temperature is fed into the first vaporization body in the direction of flow, while the aerosol with the highest vaporization temperature is fed into the last evaporation body in the direction of flow.

Here as well, feed line pipes 5, 6, 28 penetrate through openings in the heat transfer bodies 1, 2, 4, wherein the direction of pipe extension coincides with the direction of carrier gas flow.

Using a vaporization device in which several different aerosols can be vaporized simultaneously eliminates the need for an additional mixing device, in which separately generated vapors would otherwise have to be mixed. Not only is the second source material vaporized in the vaporization body 2, the vapor generated by vaporizing the first source material is also homogeneously intermixed with the vapor generated by vaporizing the second source material. Further intermixing takes place in the heat transfer body 3 arranged last in the direction of flow.

Figure 3:
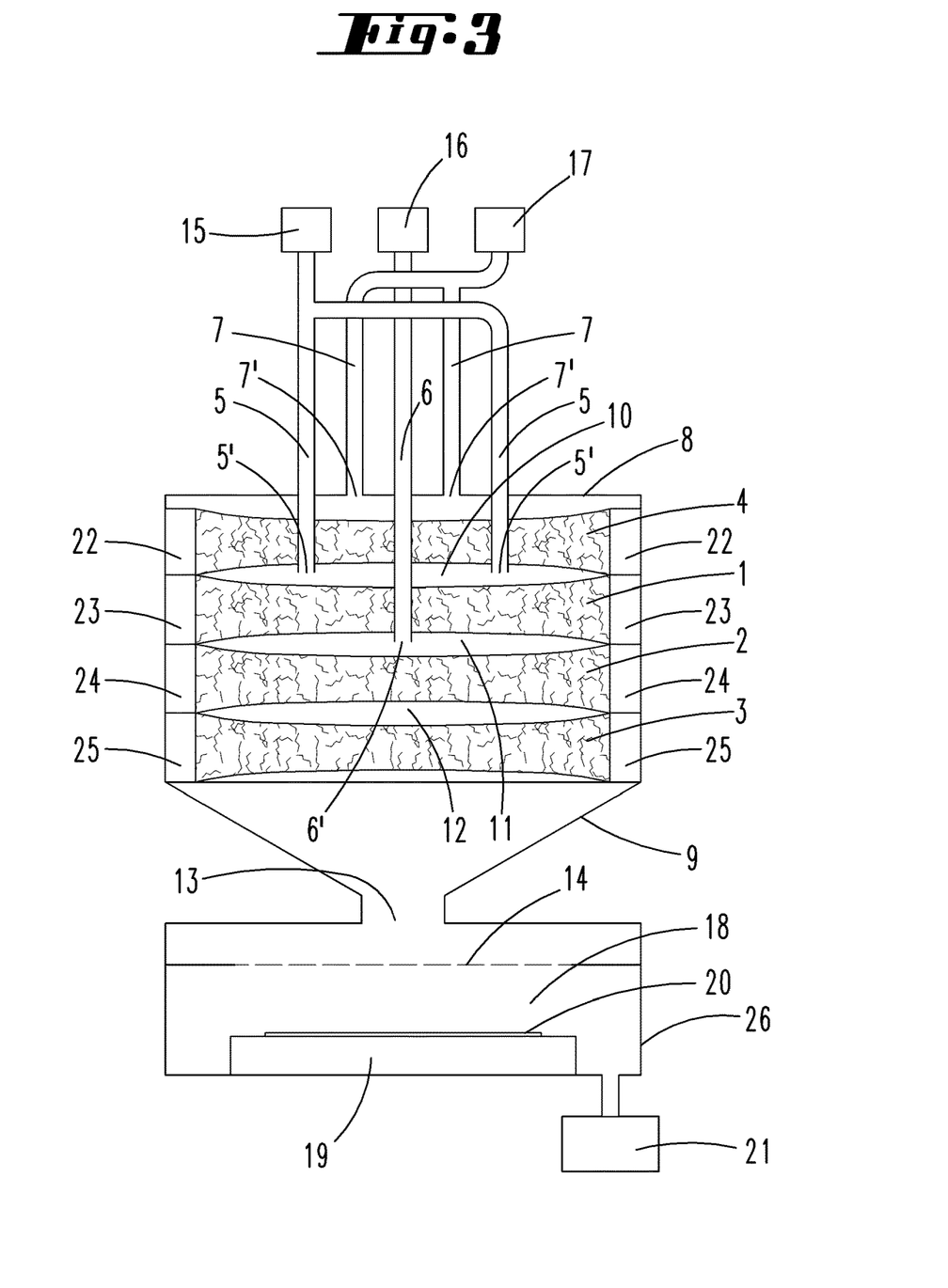
FIG. 3 is a second exemplary embodiment of the invention, in which the multistage aerosol vaporizer feeds a gas inlet unit 14 of a PVD reactor 26.

In the exemplary embodiment shown on FIG. 3, the two already generated vapors are intermixed in a third vaporization body 27 with a vapor of a third source material generated therein.

As a consequence, a homogeneous vapor mixture of several chemically differing source materials exits from the outlet surface of the last heat transfer body 3 in the direction of flow. This vapor mixture is transported to the susceptor 19 via heated connecting channels, where condensation takes place. The gas outlet surface of the last heat transfer body in the direction of flow can comprise the ceiling of a process chamber.

The above embodiments serve to explain the inventions encompassed as a whole by the application, which each separately further develop prior art at least via the following feature combinations, specifically:

A method, characterized in that solid or liquid particles of a second source material are fed into the second heat transfer body 2, and vaporization heat is transferred to these particles by bringing them into contact with heat transfer surfaces of the second heat transfer body 2, thereby forming a second vapor, which together with the first vapor is transported by the carrier gas out of the second heat transfer body 2.

A method, characterized in that the first and second vapors are transported by the carrier gas into a third heat transfer body 3 arranged a distance behind the second heat transfer body 2 in the direction of carrier gas flow.

A method, characterized in that the carrier gas is heated in a preheating body 4 arranged before the first heat transfer body 1 in the direction of carrier gas flow.

A method, characterized in that the second temperature of the second heat transfer body 2 corresponds to at least the first temperature of the first heat transfer body 1, and in particular is higher than the first temperature.

A method, characterized in that the heat transfer surfaces are the surfaces of open cells of a respective solid foam comprising the heat transfer body 1, 2, 27.

A device, characterized in that a second feed line 6 opens directly into or before the second heat transfer body 2, through which liquid or solid particles of a second source material can be fed into the second heat transfer body 2, so that vaporization heat can be transferred to these particles, and the second vapor generated by vaporizing the particles together with the first vapor can be transported by the carrier gas out of the second heat transfer body 2.

A device, characterized in that the heat transfer surfaces are comprised of the surfaces of walls of an open-cell foam body, wherein it is provided in particular that the foam body consist of electrically conductive material and can be heated by passing through an electrical current, exhibits a porosity of 500 to 200, preferably of 100 pores per inch, and/or the share of all open areas on the surface of the foam body is greater than 90 percent.

A device, characterized in that a third heat transfer body 3 is placed downstream from the second heat transfer body 2 in the direction of carrier gas flow, wherein in particular a clearance space 9 is situated between the second heat transfer body 2 and the third heat transfer body 3.

A device, characterized in that a preheating body 4 with which the carrier gas can be heated is arranged before the first heat transfer body 1 in the direction of flow.

A device or a method, characterized in that all vaporization bodies 1, 2, 3 as well as the preheating body are comprised of open-celled foam bodies, and can be electrically heated.

A device or a method, characterized in that the first and second source material can each be fed in as a respective aerosol through a feed line 5, 6, which opens into an intermediate space 10, 11 between two foam bodies.

A device or a method, characterized in that the device is part of a CVD or PVD reactor 26 that exhibits a gas inlet unit and a susceptor 19, wherein the first and second vapor transported by the carrier gas is transported through the gas inlet unit 14 in the direction toward a substrate 20 resting on the susceptor 19, where it condenses in response to a chemical reaction or temperature drop, wherein in particular a vacuum pump 21 is provided to evacuate the interior of the CVD or PVD reactor.

A device or a method, characterized in that several heat transfer bodies 1, 2, 27 are arranged one after the other in the direction of carrier gas flow, before or into which a respective aerosol feed line 5, 6, 28 opens, wherein differing source materials can be fed through the aerosol feed lines 5, 6, 28 into the heat transfer body 1, 2, 27 as a respective aerosol.

A device or a method, characterized in that the gas outlet surface of a heat transfer body 3 arranged last in the direction of flow lies directly opposite a susceptor 19 carrying a substrate, and in particular comprises the ceiling of a process chamber.

All disclosed features are essential to the invention (whether taken separately or in combination). The disclosure content of the accompanying/attached priority documents (copy of prior application) is hereby also included in the disclosure of the application in its entirety, including for the purpose of also incorporating features of these documents into claims of the present application. The subclaims with their features characterize independent inventive further developments of prior art, in particular to initiate partial applications based upon these claims.

Reference List

| | |
|---|---|
| 1 | Heat transfer body |
| 2 | Heat transfer body |
| 3 | Heat transfer body |
| 4 | Preheating body |
| 5 | Feed line |
| 5' | Opening |
| 6 | Feed line |
| 6' | Opening |
| 7 | Feed line |
| 7' | Opening |
| 8 | Housing |
| 9 | Clearance space |
| 10 | Intermediate space |
| 11 | Intermediate space |
| 12 | Intermediate space |
| 13 | Gas outlet opening |
| 14 | Gas inlet unit |
| 15 | Aerosol generator |
| 16 | Aerosol generator |
| 17 | Carrier gas source |
| 18 | Process chamber |
| 19 | Susceptor |
| 20 | Substrate |
| 21 | Vacuum pump |
| 22 | Contacts |
| 23 | Contact |
| 24 | Contact |
| 25 | Contact |
| 26 | Reactor |
| 27 | Heat transfer body |
| 28 | Feed line |

The invention claimed is:

1. An apparatus for generating a vapor for a chemical vapor deposition (CVD) or physical vapor deposition (PVD) device, the apparatus comprising:

a first aerosol source (15) configured to generate a first aerosol flow of particles of a first source material, wherein said particles of the first source material comprise either of liquid particles and solid articles;

a first feed line (5) configured to feed the first aerosol flow of particles of the first source material from the first aerosol source (15) into a first heat transfer body (1);

the first heat transfer body (1) having heat transfer surfaces that are configured to, when heated to a first temperature, vaporize the particles of the first source material into a first vapor, wherein the first vapor is transported out of the first heat transfer body (1) by a carrier gas in a direction of a flow of the carrier gas;

a second aerosol source (16) configured to generate a second aerosol flow of particles of a second source material, wherein said particles of the second source material comprise either of liquid particles and solid particles;

a second feed line (6) configured to feed the second aerosol flow of the particles of the second source material from the second aerosol source (16) into a second heat transfer body (2); and the second heat transfer body (2) arranged downstream of the first heat transfer body (1) in the direction of the carrier gas flow, the second heat transfer body (2) configured to receive the first vapor from the first heat transfer body (1) and having heat transfer surfaces that are configured to, when heated to a second temperature, vaporize the particles of the second source material into a second vapor, wherein the second vapor along with the first vapor are transported out of the second heat transfer body (2) by the carrier gas.

2. The apparatus of claim 1, wherein the heat transfer surfaces of the first heat transfer body (1) and the second heat transfer body (2) are formed by surfaces of porous cells of a foam body,
   wherein the foam body comprises an electrically conductive material that is heated by passing an electrical current through the foam body,
   wherein the foam body has a porosity of 50 to 500 pores per inch, and/or
   wherein a proportion of porous areas on a surface of the foam body is greater than 90 percent.

3. The apparatus of claim 1, further comprising a third heat transfer body (3) located downstream from the second heat transfer body (2) in the direction of the carrier gas flow, wherein a clearance space (12) is situated between the second heat transfer body (2) and the third heat transfer body (3).

4. The apparatus of claim 3, further comprising a preheating body (4) with which the carrier gas is heated, the preheating body (4) located upstream from the first heat transfer body (1) in the direction of the carrier gas flow.

5. The apparatus of claim 4, wherein the first heat transfer body (1), the second heat transfer body (2), and the third heat transfer body (3), as well as the preheating body (4) comprise foam bodies with porous cells, the foam bodies being formed from an electrically conductive material that is heated when an electrical current is flowed through the foam bodies.

6. The apparatus of claim 5,
   wherein the first feed line (5) opens into an intermediate space (10) located between the preheating body (4) and the first heat transfer body (1), and
   wherein the second feed line (6) opens into an intermediate space (11) located between the first heat transfer body (1) and the second heat transfer body (2).

7. The apparatus of claim 1, further comprising:
   a gas inlet unit (14) and a susceptor (19), wherein the first and second vapors are transported by the carrier gas through the gas inlet unit (14) toward a substrate (20) resting on the susceptor (19), on which the first and second vapors condense in response to a chemical reaction or temperature drop; and
   a vacuum pump (21) configured to evacuate an interior of the CVD or PVD device.

8. The apparatus of claim 1, wherein the first source material and the second source material differ from one another.

9. The apparatus of claim 3, wherein a gas outlet surface of the third heat transfer body (3) lies directly opposite a susceptor (19) carrying a substrate, and comprises a ceiling of a process chamber.

* * * * *